United States Patent
Yoo et al.

(10) Patent No.: US 7,651,908 B2
(45) Date of Patent: Jan. 26, 2010

(54) METHODS OF FABRICATING IMAGE SENSORS

(75) Inventors: Gil-Sang Yoo, Gyeonggi-do (KR); Byung-Jun Park, Suwon-si (KR)

(73) Assignee: Samsung Electronic Co., Ltd., Gyeonggi-do (KR)

( * ) Notice: Subject to any disclaimer, the term of this patent is extended or adjusted under 35 U.S.C. 154(b) by 416 days.

(21) Appl. No.: 11/706,371

(22) Filed: Feb. 15, 2007

(65) Prior Publication Data

US 2007/0196947 A1    Aug. 23, 2007

(30) Foreign Application Priority Data

Feb. 17, 2006    (KR) ...................... 10-2006-0015627

(51) Int. Cl.
*H01L 21/8242* (2006.01)
(52) U.S. Cl. ........................ 438/243; 438/244; 438/387; 438/396; 257/68; 257/296; 257/535; 257/E29.346; 257/E27.092; 257/E21.648; 257/E21.649; 257/297; 257/298; 257/299; 257/300; 257/301; 257/302; 257/303; 257/304; 257/305; 257/306; 257/307; 257/308; 348/308
(58) Field of Classification Search ................. 438/243, 438/244, 387, 396; 257/68, 296–308, 535; 257/E29.346, E27.092, E21.648–649; 348/308
See application file for complete search history.

(56) References Cited

U.S. PATENT DOCUMENTS 6,239,010 B1    5/2001  Lu
6,514,815 B2    2/2003  Hsue et al.
2006/0006441 A1*  1/2006  Park et al. .................... 257/296
2006/0157766 A1*  7/2006  Won et al. .................... 257/296

FOREIGN PATENT DOCUMENTS

KR    100243275 B1    11/1999

* cited by examiner

*Primary Examiner*—Charles D Garber
*Assistant Examiner*—Yasser A Abdelaziez
(74) *Attorney, Agent, or Firm*—Harness, Dickey & Pierce, P.L.C.

(57) ABSTRACT

A method of fabricating an image sensor which reduces fabricating costs through simultaneous formation of capacitor structures and contact structures may be provided. The method may include forming a lower electrode on a substrate, forming an interlayer insulating film on the substrate, the interlayer insulating film may have a capacitor hole to expose a first portion of the lower electrode. The method may further include forming a dielectric film on at least the first portion of the lower electrode, forming a first contact hole in the interlayer insulating film to expose a second portion of the lower electrode, forming a first conductive layer in at least the first contact hole and the capacitor hole, forming a second conductive layer on the first conductive layer to fill and cover the capacitor hole and the first contact hole, and planarizing the second conductive layer to simultaneously form a capacitor plug in the capacitor hole, a first contact plug in the first contact hole, an upper electrode beneath the capacitor plug, and a first contact barrier film beneath the first contact plug.

20 Claims, 6 Drawing Sheets

METHODS OF FABRICATING IMAGE SENSORS

PRIORITY STATEMENT

This application claims priority under 35 U.S.C. § 119 to Korean Patent Application No. 10-2006-0015627, filed on Feb. 17, 2006, in the Korean Intellectual Property Office (KIPO), the entire disclosure of which is incorporated herein by reference.

BACKGROUND

1. Field

Example embodiments may relate to methods of fabricating semiconductor devices, for example, to methods of fabricating image sensors.

2. Conventional Art

An image sensor may be a semiconductor device to convert an optical image to an electrical signal. FIG. 1 is a block diagram depicting a conventional image sensor, for example, a CMOS image sensor. Referring to FIG. 1, the conventional CMOS image sensor may include a pixel array region to transmit an optical signal and a logic region for realizing an image. For example, the logic region may control or process the optical signal to realize the image. For example, the optical signal may be a signal comprising information regarding the image.

The pixel array region may include a plurality of unit pixels arranged in arrays. Each of the unit pixels may include a photo-diode (or alternatively, a photo-sensitive device) to detect an optical signal and transmitting devices for transmitting an electrical signal based on the optical signal. The logic region may include a capacitor block to store analog signals, an analog digital converter (ADC) block to transform the analog signals to digital signals, a decoder/driver block to select unit pixels, and a control register block.

According to a method of fabricating a conventional image sensor, to form a capacitor structure in the capacitor block, a contact structure connected to a lower electrode may be formed after a lower electrode, a dielectric layer, and an upper electrode are formed. If the upper electrode is formed in a hole or in a trench of an interlayer insulating layer, an additional planarizing process may be required to planarize the upper electrode, and to form a contact plug for the contact structure. Furthermore, further additional processes to form contact structures connected to transistors in other logic regions may be required.

U.S. Pat. No. 6,239,010 by Jau-Hone Lu discloses a method of manufacturing a wiring structure that connects an upper electrode of a capacitor and a wiring structure that connects a gate electrode, simultaneously. However, the method may also require additional processes for forming the contact structure connected to the lower electrode of the capacitor. Moreover, after the contact plug is formed, a trench in a capacitor portion may remain unfilled. Therefore, further planarizing processes may be required.

Additionally, this structure includes metal silicide in the gate electrode and the lower electrode, which may be a drawback. For example, if the structure is applied to an image sensor, an additional photolithography and etching process may be required to remove the metal silicide in the pixel array region to reduce dark defects and noise in the pixel array region.

SUMMARY

Example embodiments may provide methods of fabricating an image sensor such that fabrication costs of the image sensor may be reduced or significantly reduced. For example, the method may include forming a capacitor structure and contact structures simultaneously.

According to an example embodiment, a method of fabricating an image sensor may include forming a lower electrode on a substrate, forming an interlayer insulating film on the substrate, the interlayer insulating film may have a capacitor hole to expose a first portion of the lower electrode. The method may further include forming a dielectric film on at least the first portion of the lower electrode, forming a first contact hole in the interlayer insulating film to expose a second portion of the lower electrode, forming a first conductive layer in at least the first contact hole and the capacitor hole, forming a second conductive layer on the first conductive layer to fill and cover the capacitor hole and the first contact hole, and planarizing the second conductive layer to form a capacitor plug in the capacitor hole, a first contact plug in the first contact hole, an upper electrode beneath the capacitor plug, and a first contact barrier film beneath the first contact plug.

In an example embodiment, the lower electrode may include a polysilicon layer.

In an example embodiment, the substrate is a semiconductor.

In an example embodiment, the first conductive layer may be formed on an entire exposed surface of the interlayer insulating film and the dielectric film, the upper electrode may include a portion of the first conductive layer remaining in the capacitor hole, and the first contact barrier film may include a portion of first conductive layer remaining in the first contact hole.

In an example embodiment, the dielectric film may further be formed on the interlayer insulating film, and the first contact hole may further pass through the dielectric film.

In an example embodiment, the method may further include injecting dopants into the first portion of the lower electrode exposed by the capacitor hole, and activating the dopants before forming the dielectric film.

In an example embodiment, planarizing the second conductive layer may include a Chemical Mechanical Polishing method.

In an example embodiment, the first conductive layer may include one of Ti, TiN, and a composite of Ti and TiN.

In an example embodiment, the second conductive layer may include tungsten.

In an example embodiment, the method may further include forming a polysilicon layer on the substrate including a pixel array region and a logic region, patterning the poly silicon layer to form a first gate electrode in the pixel array region and the lower electrode in the logic region, and forming a second contact hole through the interlayer insulating film to expose a portion of the pixel array region.

In an example embodiment, the first conductive layer may be formed in at least the first contact hole, the second contact hole, and the capacitor hole. In an example embodiment, the second conductive layer may be formed on the first conductive layer to fill and cover the capacitor hole, the first contact hole, and the second contact hole. In an example embodiment, planarizing the second conductive layer may include forming a second contact plug in the second contact hole, and a second contact barrier film beneath the second contact plug.

In an example embodiment, the dielectric film may further be formed on the interlayer insulating film, and the first and second contact holes may be formed through the dielectric film and the interlayer insulating film.

In an example embodiment, patterning the poly silicon layer may include forming a second gate electrode in the logic region, and the lower electrode, the first gate electrode, and the second gate electrode may be formed simultaneously.

In an example embodiment, the method may further include forming a third contact hole through the interlayer insulating film to expose a portion of the logic region of the semiconductor substrate. The first conductive layer may be formed in at least the first contact hole, the second contact hole, the third contact hole, and the capacitor hole. The second conductive layer may be formed on the first conductive layer to fill and cover the capacitor hole, the first contact hole, the second contact hole, and the third contact hole. Planarizing the second conductive layer may include forming a third contact plug in the third contact hole, a third contact barrier film beneath the third contact plug, a second contact plug in the second contact hole, and a second contact barrier film beneath the second contact plug.

In an example embodiment, the capacitor plug, the first contact plug, the second contact plug, and the third contact plug may be formed simultaneously, and the upper electrode, the first contact barrier film, the second contact barrier film, and the third contact barrier film may be formed simultaneously.

In an example embodiment, the method may further include forming a polysilicon layer on the substrate including a pixel array region and a logic region, patterning the polysilicon later to form a gate electrode in the pixel array region and the lower electrode in the logic region, forming an upper electrode layer on an at least the dielectric film and exposed portions of the interlayer insulating film, and forming a capacitor barrier film that includes a portion of the first conductive layer remaining in the capacitor hole.

In an example embodiment, the upper electrode layer-may be formed on an entire exposed surface of the interlayer insulating film and the dielectric film, the upper electrode may include a portion of the upper electrode layer remaining in the capacitor hole, and the first contact barrier film may include a portion of the first conductive layer remaining in the first contact hole.

In an example embodiment, patterning the poly silicon layer may include forming a second gate electrode in the logic region. The lower electrode, the first gate electrode, and the second gate electrode may be formed simultaneously.

In an example embodiment, the method may further include forming a second contact hole through the interlayer insulating film to expose a portion of the pixel array region. The first conductive layer may be formed in at least the first contact hole, the second contact hole, and the capacitor hole. The second conductive layer may be formed on the first conductive layer to fill and cover the capacitor hole, the first contact hole, and the second contact hole. Planarizing the second conductive layer may include forming a second contact plug in the second contact hole and a second contact barrier film beneath the second contact plug.

In an example embodiment, the method may further include forming a third contact hole through the interlayer insulating film to expose a portion of the logic region of the semiconductor substrate. The first conductive layer may be formed in at least the first contact hole, the second contact hole, the third contact hole, and the capacitor hole, the second conductive layer may be formed on the first conductive layer to fill and cover the capacitor hole, the first contact hole, the second contact hole, and the third contact hole, and planarizing the second conductive layer may include forming a third contact plug and a third contact barrier film beneath the third contact plug.

According to an example embodiment, a method of fabricating an image sensor may include forming a lower electrode including a polysilicon layer on a semiconductor substrate. The method may further include forming an interlayer insulating film having a capacitor hole exposing a portion of the lower electrode, on the semiconductor substrate, forming a dielectric film on at least a portion of the lower electrode, forming a contact hole that exposes another portion of the lower electrode through the interlayer insulating film, forming a first conductive layer on an entire upper surface of the resultant product on which the contact hole is formed, forming a second conductive layer on the first conductive layer to fill and cover the capacitor hole and the contact hole, forming a capacitor plug in the capacitor hole and a contact plug in the contact hole simultaneously by planarizing the second conductive layer, and forming an upper electrode including a portion of the first conductive layer remaining in the capacitor hole and a contact barrier film that includes a portion of the first conductive layer remaining in the contact hole simultaneously by removing the first conductive layer on the interlayer insulating film.

According to example embodiment, a method of fabricating an image sensor may include forming a polysilicon layer on a semiconductor substrate on which a pixel array region and a logic region are defined, forming a gate electrode in the pixel array region of the semiconductor substrate and a lower electrode in a portion of the logic region of the semiconductor substrate by patterning the polysilicon layer, forming an interlayer insulating film having a capacitor hole that exposes a portion of the lower electrode, on the semiconductor substrate, forming a dielectric film on at least a portion of the lower electrode, forming a first contact hole that exposes another portion of the lower electrode through the interlayer insulating film, forming a second contact hole that exposes a portion of the pixel array region of the semiconductor substrate through the interlayer insulating film, forming a first conductive layer on an entire upper surface of the resultant product on which the first and second contact holes are formed, forming a second conductive layer on the first conductive layer to fill and cover the capacitor hole, the first contact hole, and the second contact hole, and forming a capacitor plug in the capacitor hole, a first contact plug in the first contact hole, and a second contact plug in the second contact hole simultaneously by planarizing the second conductive layer.

The method may further include forming an upper electrode including a portion of the first conductive layer remaining in the capacitor hole, a first contact barrier film including a portion of the first conductive layer in the first contact hole, and a second contact barrier film that comprises a portion of the first conductive layer remaining in the second contact hole simultaneously through removal of portions of the first conductive layer formed on the interlayer insulating film.

The method may further include forming another gate electrode in a portion of the logic region of the semiconductor substrate by patterning the polysilicon layer. The lower electrode, the gate electrode, and the other gate electrode may be formed simultaneously.

The method may further include forming a third contact hole exposing another portion of the logic region of the semiconductor substrate through the interlayer insulating film, forming a third contact plug in the third contact hole by planarizing the second conductive layer, and forming a third contact barrier film including a portion of the first conductive layer remaining in the third contact hole by removing the first conductive layer on the interlayer insulating film.

According to example embodiment, a method of fabricating an image sensor may include forming a polysilicon layer on a semiconductor substrate on which a pixel array region and a logic region are defined and forming a gate electrode in the pixel array region of the semiconductor substrate and a lower electrode in a portion of the logic region of the semiconductor substrate by patterning the polysilicon layer. The method may further include forming an interlayer insulating film having a capacitor hole that exposes a portion of the lower electrode, on the semiconductor substrate and forming a dielectric film at least on a portion of the lower electrode.

The method may further include forming an upper electrode layer on an entire upper surface of the resultant product on which the dielectric film is formed, forming a first contact hole that exposes another portion of the lower electrode through the interlayer insulating film and the upper electrode layer, forming a first conductive layer on an entire upper surface of the resultant product on which the first contact hole is formed, forming a second conductive layer on the first conductive layer to fill and cover the capacitor hole and the first contact hole, forming a capacitor plug in the capacitor hole and a first contact plug in the first contact hole simultaneously by planarizing the second conductive layer, forming a capacitor barrier film that comprises a portion of the first conductive layer remaining in the capacitor hole and a first contact barrier film that comprises a portion of the first conductive layer remaining in the first contact hole simultaneously by removing portions of the first conductive layer on the interlayer insulating layer, and forming an upper electrode that comprises a portion of the upper electrode layer remaining in the capacitor hole by removing the upper electrode layer on the interlayer insulating layer.

BRIEF DESCRIPTION OF THE DRAWINGS

Example embodiments will become more apparent by describing them in detail with reference to the attached drawings in which.

DETAILED DESCRIPTION OF EXAMPLE EMBODIMENTS

Figure 1:
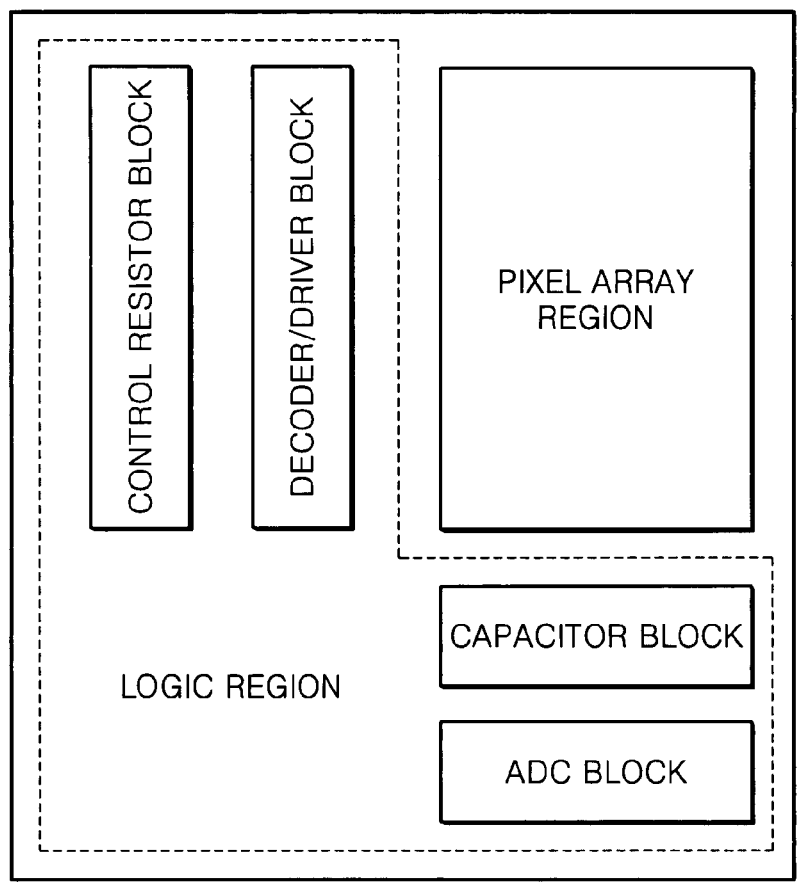
FIG. 1 is a block diagram depicting the configuration of a conventional image sensor.

Detailed illustrative embodiments are disclosed herein. However, specific structural and functional details disclosed herein are merely representative for purposes of describing example embodiments. Example embodiments may, however, be embodied in many alternate forms and should not be construed as limited to only the embodiments set forth herein.

It will be understood that if an element or layer is referred to as being "on," "against," "connected to" or "coupled to" another element or layer, then it can be directly on, against connected or coupled to the other element or layer, or intervening elements or layers may be present. In contrast, if an element is referred to as being "directly on", "directly connected to" or "directly coupled to" another element or layer, then there are no intervening elements or layers present. Like numbers refer to like elements throughout. As used herein, the term "and/or" includes any and all combinations of one or more of the associated listed items.

Spatially relative terms, such as "beneath", "below", "lower", "above", "upper" and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, term such as "below" can encompass both an orientation of above and below. The device may be otherwise oriented (rotated 90 degrees or at other orientations) and the spatially relative descriptors used herein interpreted accordingly.

Although the terms first, second, etc. may be used herein to describe various elements, components, regions, layers and/or sections, it should be understood that these elements, components, regions, layers and/or sections should not be limited by these terms. These terms are used only to distinguish one element, component, region, layer or section from another region, layer or section. Thus, a first element, component, region, layer or section discussed below could be termed a second element, component, region, layer or section without departing from the teachings of the present invention.

The terminology used herein is for the purpose of describing particular embodiments only and is not intended to be limiting of example embodiments. As used herein, the singular forms "a", "an" and "the" are intended to include the plural forms as well, unless the context clearly indicates otherwise. It will be further understood that the terms "includes" and/or "including", when used in this specification, specify the presence of stated features, integers, steps, operations, elements, and/or components, but do not preclude the presence or addition of one or more other features, integers, steps, operations, elements, components, and/or groups thereof.

Example embodiments will now be described more fully with reference to the accompanying drawings, in which example embodiments are shown. Example embodiments may, however, be embodied in many different forms and should not be construed as being limited to the embodiments set forth herein; rather, these embodiments are provided so that this disclosure will be thorough and complete, and will fully convey the concept of the invention to those skilled in the art. In the drawings, the dimensions of elements are exaggerated for clarity.

FIGS. 2 through 8 are cross-sectional views illustrating a method of fabricating an image sensor, according to an example embodiment.

Figure 2:
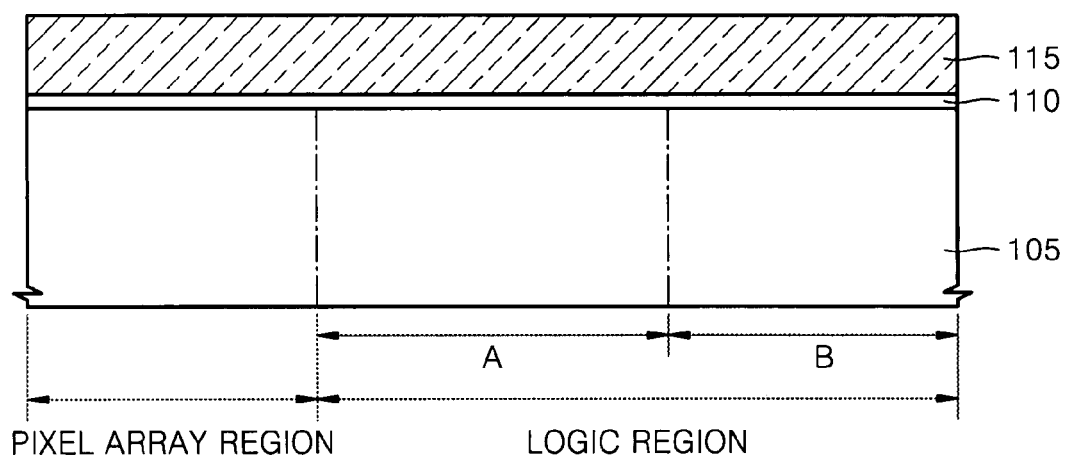
FIGS. 2 through 8 are cross-sectional views illustrating a method of fabricating an image sensor, according to an example embodiment.

Referring to FIG. 2, an insulating layer 110 and a poly silicon layer 115 may be formed on a semiconductor substrate 105. The insulating layer 110 may be formed, for example, using chemical vapor deposition (CVD), thermal oxidation, and/or any suitable method. The poly silicon layer 115 may be formed, for example, using CVD and/or any suitable method.

A pixel array region and a logic region may be defined on the semiconductor substrate 105. The pixel array region may include a plurality of unit pixels (not shown) arranged in arrays. The unit pixels may include a photo diode (not shown; or alternatively, a photo-sensitive device) for detecting an optical signal, and a transmitting device for transmitting an electrical signal (not shown). The structure of the unit pixels may include structure well known in the art, and thus detailed description thereof will be omitted herein for the sake of brevity.

The logic region may include logic devices (not shown) to realize images by controlling and/or processing electrical signals. For example, the layout of the pixel array region and the logic region may be the same as the layout of the device of FIG. 1. For example, the logic region may include a capacitor block, an ADC block, a decoder/driver block, and a control register block. However, the logic region according to example embodiments is not limited to only these examples, and may further include other blocks or any other suitable alternative blocks.

Referring to FIG. 2, a block A may represent a capacitor block and a block B may represent an ADC block, for example. However, in at least one example embodiment, block B may be the decoder/driver block or the control register block. Furthermore, block A and block B may not be clearly divided. That is, the ADC block may include the capacitor block or vice versa.

Figure 3:
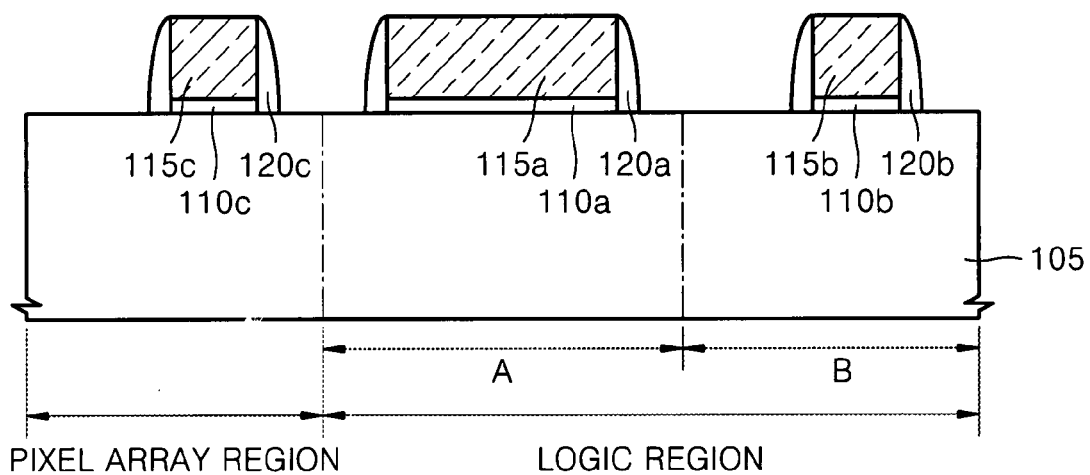

Referring to FIG. 3, a lower electrode 115a formed on block A of the logic region, a first gate electrode 115c formed on the pixel array region, and/or a second gate electrode 115b on block B of the logic region may be formed by patterning the poly silicon layer 115. The lower electrode 115a, the first gate electrode 115c, and the second gate electrode 115b may be formed simultaneously, but may also be formed sequentially or separately. The patterning may be performed using photolithography and/or etching, and such processes are well known in the art.

The insulating layer 110 may also be patterned in addition to the poly silicon layer 115. Accordingly, a first insulating film 110a may be interposed between the lower electrode 115a and the semiconductor substrate 105, a second insulating film 110c may be interposed between the first gate electrode 115c and the semiconductor substrate 105, and a third insulating film 110b may be interposed between the second gate electrode 115b and the semiconductor substrate 105.

Spacer insulating films 120a, 120b, and 120c may be formed on sidewalls of the lower electrode 115a, the first gate electrode 115c, and the second gate electrode 115b, respectively. The spacer insulating films 120a, 120b, and 120c may be formed, for example, by anisotropic etching of an insulating layer (not shown) subsequent to forming the insulating layer on an upper surface of the semiconductor substrate 105.

Figure 4:
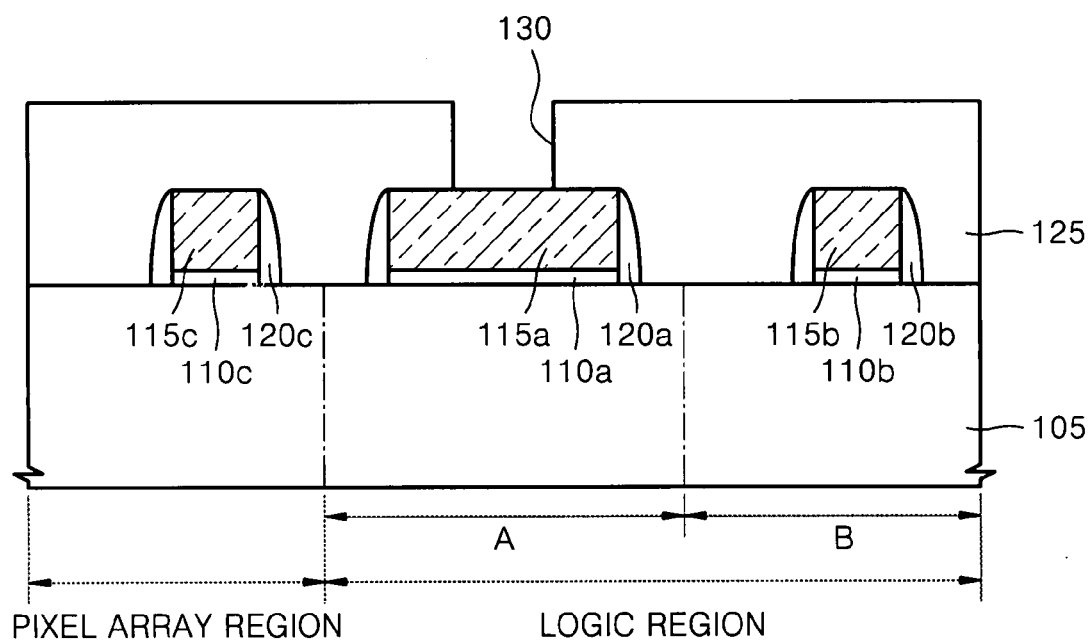

Referring to FIG. 4, an interlayer insulating film 125 may be formed on the semiconductor substrate 105. The interlayer insulating film 125 may include a capacitor hole 130 exposing a portion of the lower electrode 115a. The interlayer insulating film 125 may be formed of, for example, silicon oxide or silicon nitride. For example, subsequent to formation of an interlayer insulating layer (not shown) on the semiconductor substrate 105, the capacitor hole 130 (e.g., the hole that exposes an upper portion of the lower electrode 115a through the interlayer insulating layer) may be formed. An etch mask (not shown) exposing a portion of the interlayer insulating layer is formed to manufacture the capacitor hole 130. Subsequently, the capacitor hole 130 may be formed by etching the exposed interlayer insulating layer using the etch mask as a protective film and/or etching mask.

Dopants may be injected into a portion of the lower electrode 115a exposed by the capacitor hole 130, and may be activated by thermal annealing or any suitable process.

Figure 5:
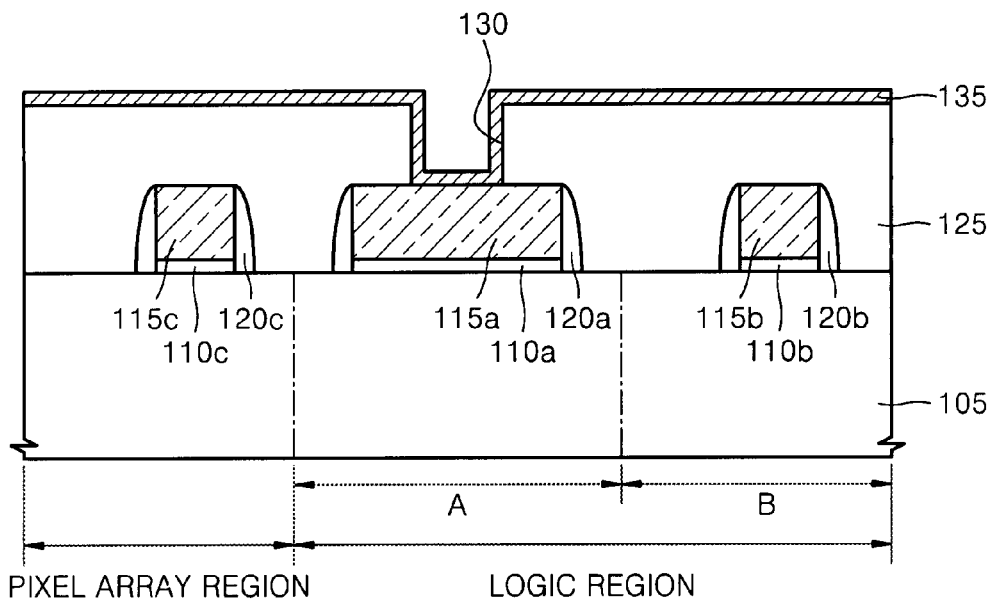

Referring to FIG. 5, a dielectric film 135 may be formed on the resulting structure. For example, the dielectric film 135 may be formed at least on a portion of an upper surface of the lower electrode 115a exposed by the capacitor hole 130 and/ or on the interlayer insulating film 125. For example, the dielectric film 135 may include a silicon oxide film, silicon nitride film, or a high dielectric insulating film, and may be formed using CVD or physical vapour deposition (PVD) methods. The high dielectric insulating film may include high-k materials or materials with a relatively high dielectric constant. Such materials may include, for example, $Ta_2O_5$, $Al_2O_3$, and/or $TiO_2$, although example embodiments should not be limited to only these examples. For instance, any suitable dielectric material may be equally applicable to example embodiments.

In at least one example embodiment, unlike in FIG. 5, the dielectric film 135 may be formed only on a portion of the upper surface of the lower electrode 115a exposed through the capacitor hole 130. For example, a thermal oxide film may be formed, selectively, on only a portion of the upper surface of the lower electrode 115a through thermal oxidation of the surface of the lower electrode 115a.

Figure 6:
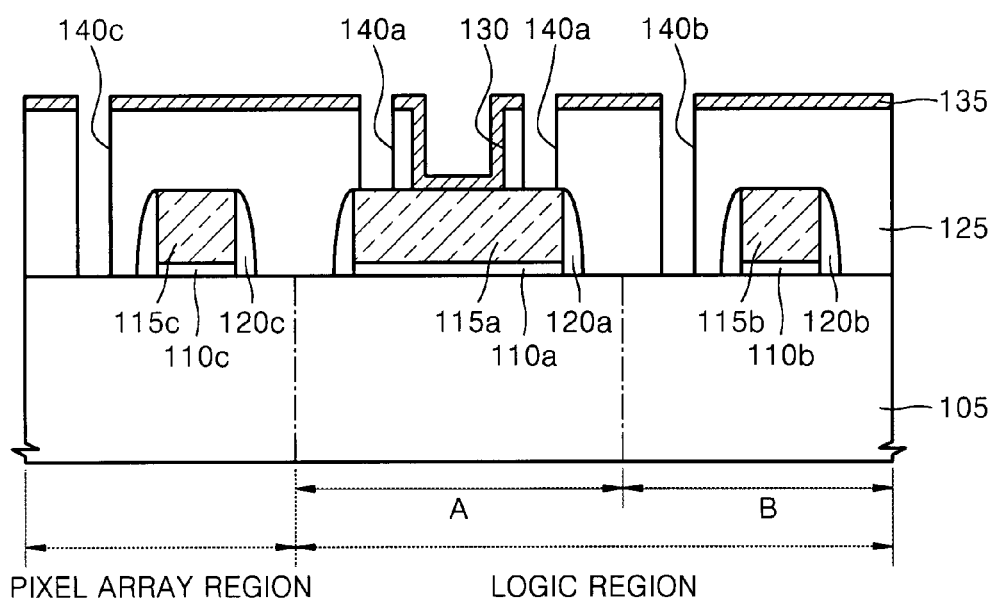

Referring to FIG. 6, at least one contact hole 140a, which may expose another portion of the lower electrode 115a through the interlayer insulating film 125 and the dielectric film 135, may be formed. A second contact hole 140c exposing a portion of the pixel array region through the interlayer insulating film 125 and the dielectric film 135 may be formed simultaneous to forming the first contact hole 140a. A third contact hole 140b exposing other portions of the logic region through the interlayer insulating film 125 and the dielectric film 135 may also be formed simultaneous to forming the first and second contact holes 140a and 140c.

The first, second, and third contact holes 140a, 140c, and 140b may be formed using a photolithography and/or an etching process. For example, the first, second, and third contact holes 140a, 140c, and 140b may be formed simultaneously using an etch mask (not shown) as a protective film after forming the etch mask that exposes portions of the dielectric film 135 where the first, second, and third contact holes 140a, 140c, and 140b are formed.

Because the contact holes 140a, 140c, and 140b may be formed simultaneously, fabrication processes may be reduced, and thereby reduce fabricating costs. However, the contact holes 140a, 140c, and 140b may be formed sequentially, or only two of the three contact holes 140a, 140c, and 140b may be formed simultaneously instead of forming the three contact holes 140a, 140c, and 140b simultaneously, and so on.

Figure 7:
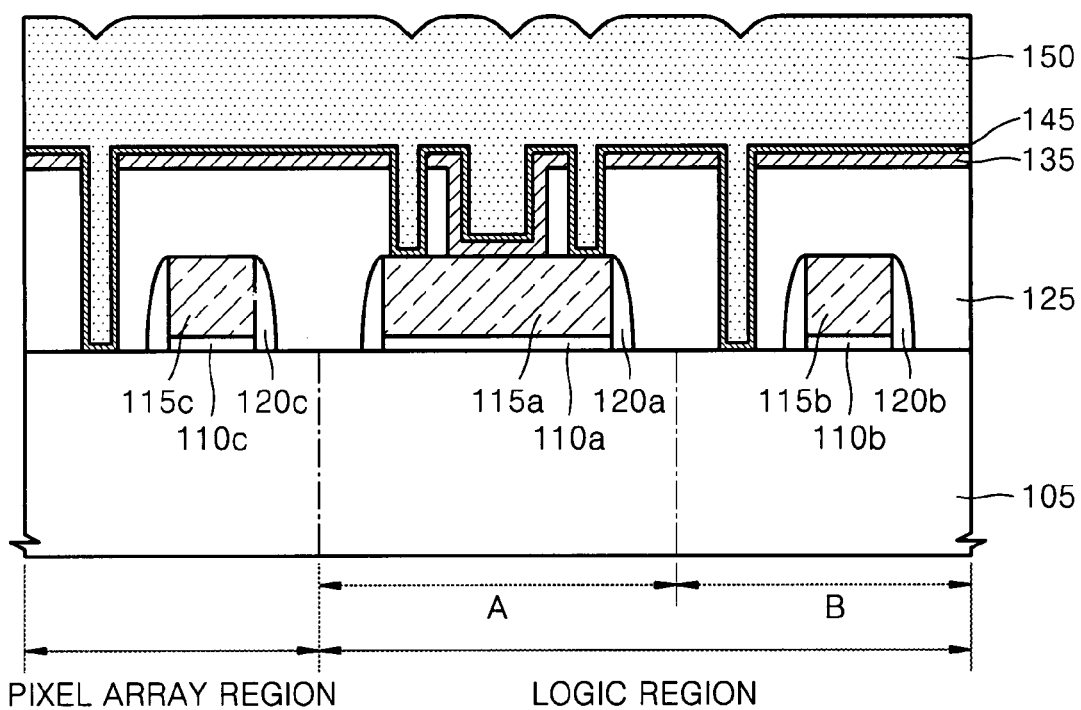

Referring to FIG. 7, a first conductive layer 145 may be formed on an entire upper surface of the resulting structure from which the contact holes 140a, 140c, and 140b are formed. For example, the first conductive layer 145 may be formed on inner surfaces of the contact holes 140a, 140c, and 140b and the capacitor hole 130. Furthermore, the first conductive later 145 may be formed on the dielectric film 135 disposed on the interlayer insulating film 125. The first conductive layer 145 may be formed, for example, using CVD or PVD methods.

The first conductive layer 145 may be formed to produce barriers films 145b, 145c, and 145d (refer to FIG. 8) and an upper electrode 145a (refer to FIG. 8) in a subsequent process. The first conductive layer 145 may be, for example, a Ti layer, a TiN layer, or a composite of theses layers such as a Ti layer/TiN layer. However, the first conductive layer 145 according to example embodiments is not limited to the above-mentioned layers, but may also include other metal layers or a metal nitride layer, such as a Ta layer, a TaN layer, a Co layer, and/or a Ni layer.

A second conductive layer 150 may be formed on the first conductive layer 145 to fill and cover the contact holes 140a, 140c, and 140b and the capacitor hole 130. The second conductive layer 150 may be, for example, a tungsten layer and may be formed using CVD. However, the second conductive layer 150 according to example embodiments is not limited to the above layers, but may also include other metal layers such as an Al layer and/or a Cu layer.

Figure 8:
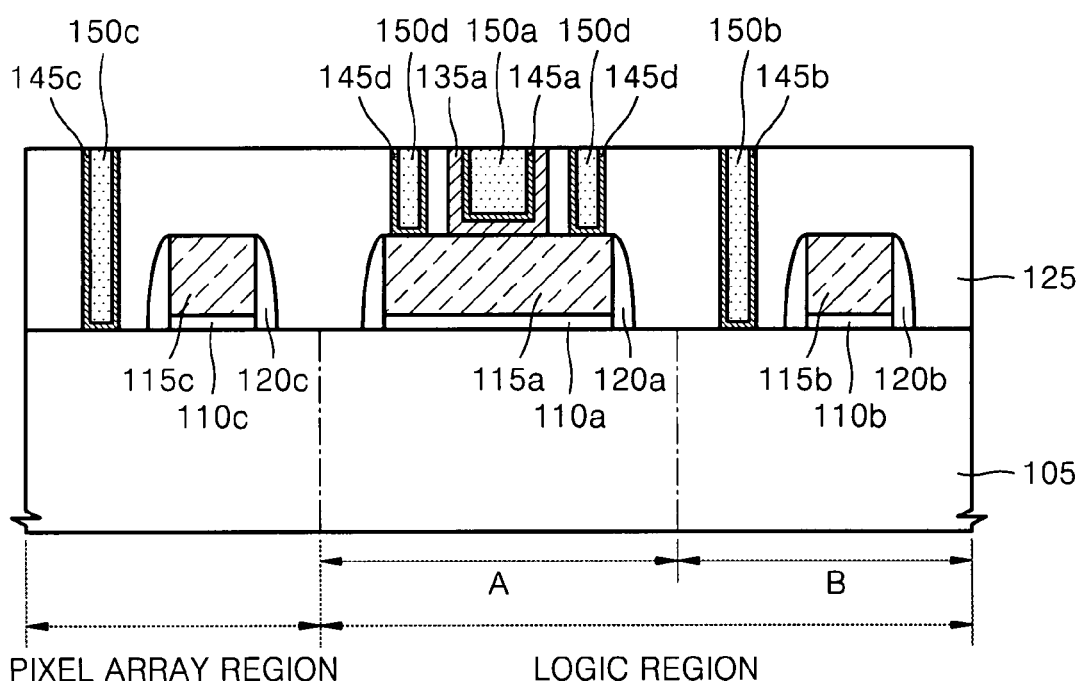

Referring to FIG. 8, a capacitor plug 150a in the capacitor hole 130, a first contact plug 150d in the first contact hole 140a, a second contact plug 150c in the second contact hole 140c, and a third contact plug 150b in the third contact hole 140b may be formed simultaneously by planarizing the second conductive layer 150. For example, the planarizing may be performed using a chemical mechanical polishing (CMP) method, but may also be performed using other methods such as an etch-back or other process.

Accordingly, the capacitor plug 150a and the contact plugs 150d, 150c, and 150b may be formed simultaneously by a single planarizing process. That is, in the conventional art, at least two relatively expensive CMP processes are required for the planarizing. However, according to example embodiments, a single planarizing process may be required, thereby reducing fabricating cost. Furthermore, the thickness variation of the capacitor plug 150a and the contact plugs 150d, 150c, and 150b, which are inherently large in a series of CMP processes, may be reduced.

However, in at least one example embodiment, only one or two of the capacitor plug 150a and the contact plugs 150d, 150c, and 150b may be formed simultaneously. Therefore, in at least the context of this example, the number of CMP processes is reduced by at least one when compared to the conventional process.

Subsequent to or at substantially the same time as the planarizing of the second conductive layer 150 (see FIG. 7), the first conductive layer 145 formed on the interlayer insulating film 125 may be removed. Accordingly, the upper electrode 145a in the capacitor hole 130, the first contact barrier film 145d in the first contact hole 140a, the second contact barrier film 145c in the second contact hole 140c, and the third contact barrier film 145b in the third contact hole 140b, may be formed simultaneously.

For example, the upper electrode 145a and the contact barrier films 145d, 145c, and 145b may be formed as remaining portions of the first conductive layer in the capacitor hole 130 and the contact holes 140d, 140c, and 140b, respectively. For example, the upper electrode 145a and the contact barrier films 145d, 145c, and 145b may be under or beneath the capacitor plug 150a, and the contact plugs 150d, 150c, and 150b, respectively. The partial removal and/or separation may be performed, for example, using a CMP method, or any other suitable method.

Accordingly, the upper electrode 145a and the contact barrier films 145d, 145c, and 145b may be formed simultaneously by a single planarizing process. That is, the multiple expensive CMP processes required in the conventional art may be reduced to a single CMP process, thereby reducing the fabrication cost of the image sensor. However, in at least one example embodiment, one or two of the upper electrode 145a and the contact barrier films 145d, 145c, and 145b may be formed simultaneously. Therefore, at least in the context of this example, the number of CMP processes required may be reduced by at least one in comparison with conventional processes.

Optionally, after or at substantially the same time as the partial removal of the first conductive layer 145, the dielectric film 135 formed on the interlayer insulating film 125 may be removed. Thus, a capacitor dielectric film 135a remaining in the capacitor hole 130 and interposed between the upper electrode 145a and the lower electrode 115a may be formed. However, in at least one example embodiment, if the dielectric film 135 is formed only on the lower electrode 115a, the process for partially removing the dielectric film 135 may be omitted.

According to example embodiments, fabricating processes may be reduced when compared to conventional methods. Accordingly, not only may fabricating costs be reduced, but the reliability of devices may also increase.

FIGS. 9 through 12 are cross-sectional views illustrating a method of fabricating an image sensor, according to an example embodiment. The fabrication processes of FIGS. 2 through 5 may also apply to the following description, and, in the drawings, the same reference numerals refer to identical elements, and thus, detailed descriptions thereof will be omitted herein for the sake of brevity.

Figure 9:
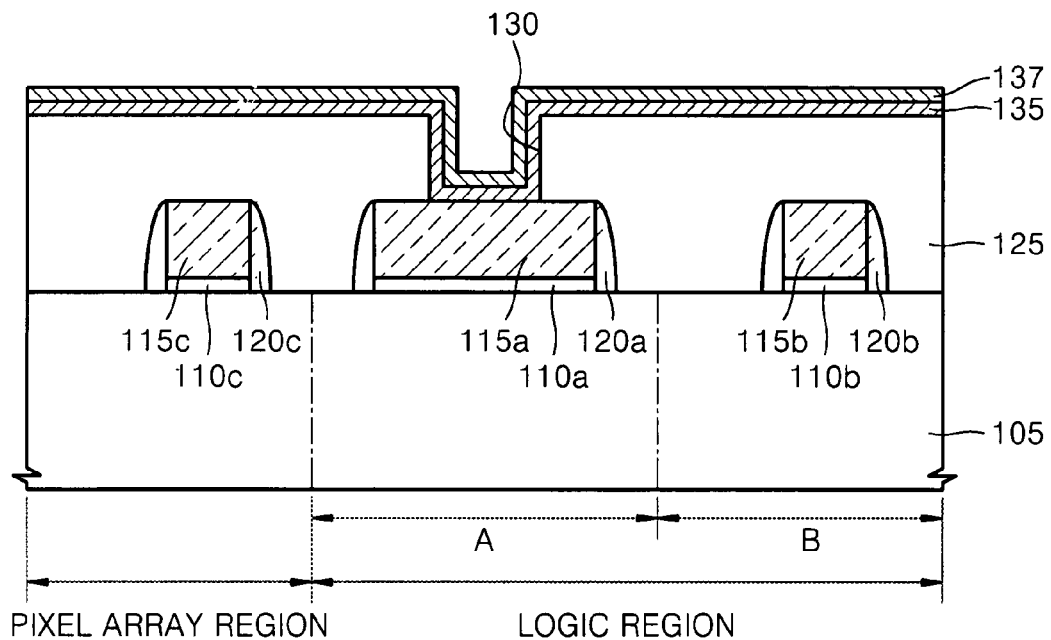
FIGS. 9 through 12 are cross-sectional views illustrating a method of fabricating an image sensor, according to an example embodiment.

Referring to FIG. 9, an upper electrode layer 137 may be formed on a dielectric film 135. The upper electrode layer 137 may be, for example, a TiN layer, and may be formed using PVD and/or CVD methods. However, the upper electrode layer 137 is not limited to the TiN layer, and may be a layer formed of another metal or any other suitable conductor.

Figure 10:
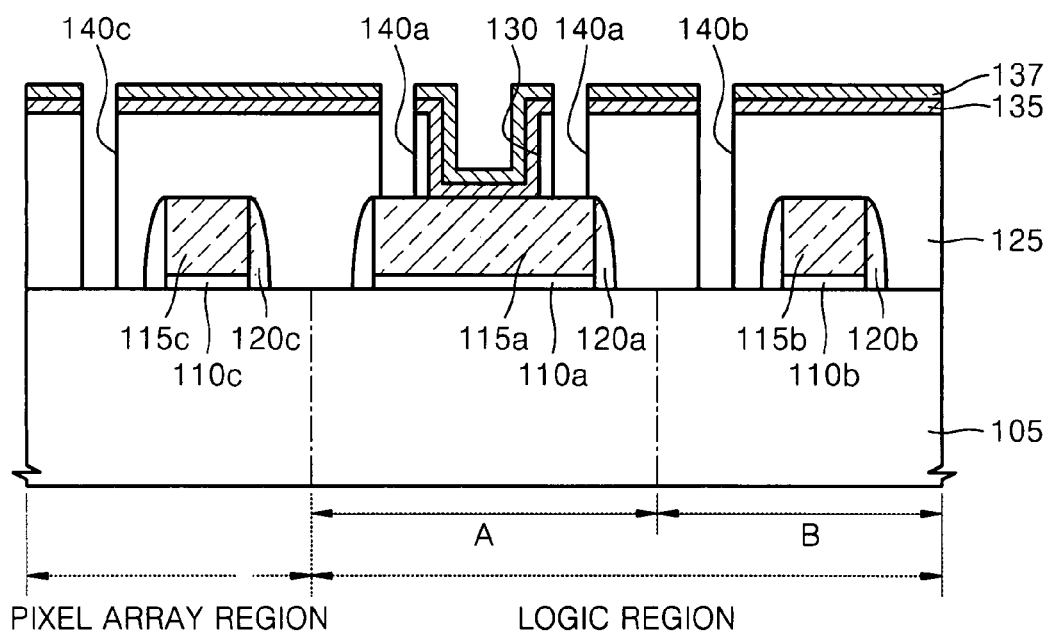

Referring to FIG. 10, at least one contact hole 140a exposing different portions of a lower electrode 115a, a second contact hole 140c exposing a portion of a pixel array region, and a third contact hole 140b exposing another portion of a logic region through the upper electrode layer 137, a dielectric film 135, and an interlayer insulating film 125 may be formed.

If the contact holes 140a, 140b, and 140c are formed simultaneously, the fabrication process of the image sensor may be simplified, thereby reducing fabricating costs. However, the contact holes 140a, 140b, and 140c are not required to be formed simultaneously, but may also be formed sequentially, or alternatively, two of the three contact holes 140a, 140b, and 140c may be formed simultaneously.

Figure 11:
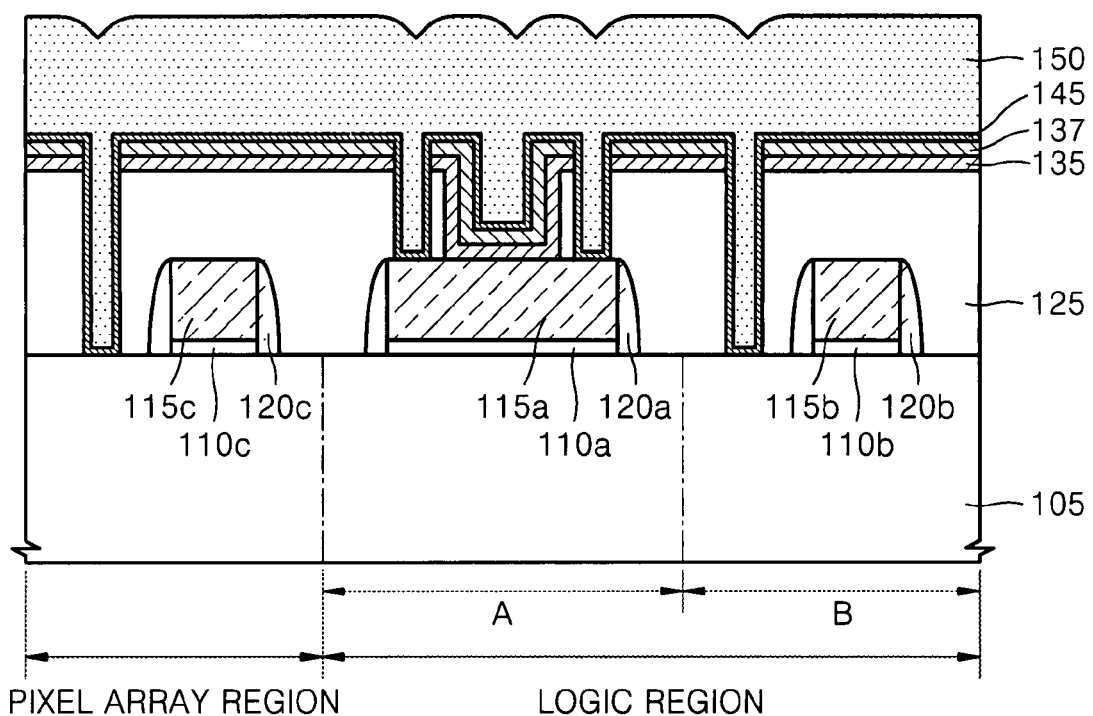

Referring to FIG. 11, a first conductive layer 145 may be formed on an entire upper surface of the resulting structure of which the contact holes 140a, 140b, and 140c are formed. For example, the first conductive layer 145 may be formed on inner surfaces of the contact holes 140a, 140b, and 140c and capacitor hole 130 (refer to FIG. 10) and on the upper electrode layer 137 formed on the interlayer insulating film 125. A second conductive layer 150 may be formed on the first conductive layer 145 to fill and cover the contact holes 140a, 140b, and 140c and the capacitor hole 130.

Figure 12:
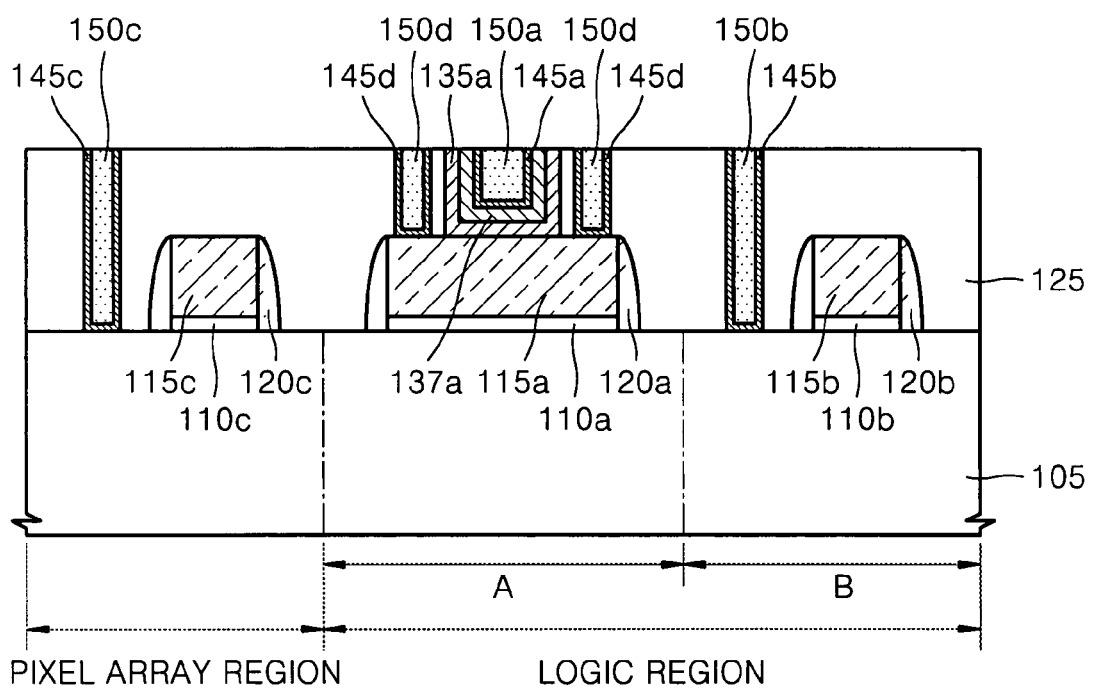

Referring to FIG. 12, a capacitor plug 150a in the capacitor hole 130, a first contact plug 150d in the first contact hole 140a, a second contact plug 150c in the second contact hole 140c, and a third contact plug 150b in the third contact hole 140b may be formed simultaneously by planarizing the second conductive layer 150.

After or at substantially the same time as planarizing the second conductive layer 150, the first conductive layer 145 (see FIG. 11) on the interlayer insulating film 125 may be removed. Accordingly, a capacitor barrier film 145a in the capacitor hole 130 (see FIG. 10), a first contact barrier film 145d (see FIG. 10) in the first contact hole 140a, a second contact barrier film 145c in the second contact hole 140c (see FIG. 10), and a third contact barrier film 145b in the third contact hole 140b (see FIG. 10) may be formed simultaneously. That is, the capacitor barrier film 145a and the contact barrier films 145d, 145c, and 145b may be formed as portions of the first conductive layer 145 in the capacitor hole 130 and the contact holes 140a, 140c, and 140b, respectively.

After or at substantially the same time as the partial removal of the first conductive layer 145, an upper electrode 137a may be formed in the capacitor hole 130 by removing the upper electrode layer 137 formed on the dielectric film 135. That is, the upper electrode 137a may be formed of a portion of the upper electrode layer 137 remaining in the capacitor hole 130.

Optionally, after or at substantially the same time as the partial removal of the upper electrode layer 137, a capacitor dielectric film 135a remaining in the capacitor hole 130 and interposed between the upper electrode 137a and the lower electrode 115a, may be formed by removing the dielectric film 135 on the interlayer insulating film 125. However, in at least one embodiment, if the dielectric film 135 (see FIG. 11) is selectively formed only on the lower electrode 115a, the process for partially removing the dielectric film 135 may be omitted.

According to example embodiments, besides the aforementioned features of FIGS. 2 and 8, the upper electrode 137a may be formed of materials different from the materials used to form the contact barrier films 145d, 145c, and 145b. For example, the upper electrode 137a may be a TiN film, and the contact barrier films 145d, 145c, and 145b may be composite films of Ti/TiN.

According to methods of fabricating image sensors according to example embodiments, in forming a capacitor structure and a contact structure, the number of relatively expensive CMP processes required may be reduced by at least one as compared to the conventional method, thereby reducing fabricating costs. Also, the thickness variation of the capacitor structure and the contact structure in the substrate which may be inherent in a series of CMP processes may also be reduced. Accordingly, not only may the fabricating cost be reduced, but the reliability of the device may also be increased. Also, according to methods of fabricating image sensors according to example embodiments, the capacitor structure may be formed of materials different from the materials used to from the contact structure, while still reducing fabrication processes.

While example embodiments have been particularly shown and described with reference the attached drawings, it will be understood by those of ordinary skill in the art that various changes in form and details may be made therein without departing from the spirit and scope of the present invention as defined by the following claims.

What is claimed is:

1. A method of fabricating an image sensor, comprising:
    forming a lower electrode on a substrate;
    forming an interlayer insulating film on the substrate, the interlayer insulating film having a capacitor hole to expose a first portion of the lower electrode;
    forming a dielectric film on at least the first portion of the lower electrode;
    forming a first contact hole through the interlayer insulating film to expose a second portion of the lower electrode;
    forming a first conductive layer in at least the first contact hole and the capacitor hole;
    forming a second conductive layer on the first conductive layer to fill and cover the capacitor hole and the first contact hole; and
    planarizing the second conductive layer to simultaneously form a capacitor plug in the capacitor hole, a first contact plug in the first contact hole, an upper electrode beneath the capacitor plug, and a first contact barrier film beneath the first contact plug.

2. The method of claim 1, wherein the lower electrode includes a polysilicon layer.

3. The method of claim 1, wherein the substrate is a semiconductor.

4. The method of claim 1, wherein:
    the first conductive layer is formed on an entire exposed surface of the interlayer insulating film and the dielectric film;
    the upper electrode includes a portion of the first conductive layer remaining in the capacitor hole; and
    the first contact barrier film includes a portion of first conductive layer remaining in the first contact hole.

5. The method of claim 1, wherein the dielectric film is further formed on the interlayer insulating film, and the first contact hole further passes through the dielectric film.

6. The method of claim 1, further comprising:
    injecting dopants into the first portion of the lower electrode exposed by the capacitor hole; and,
    activating the dopants before forming the dielectric film.

7. The method of claim 1, wherein planarizing the second conductive layer includes a Chemical Mechanical Polishing method.

8. The method of claim 1, wherein the first conductive layer includes one of Ti, TiN, and a composite of Ti and TiN.

9. The method of claim 1, wherein the second conductive layer includes tungsten.

10. The method of claim 1, further comprising:
    forming a polysilicon layer on the substrate including a pixel array region and a logic region;
    patterning the polysilicon layer to form a first gate electrode in the pixel array region and the lower electrode in the logic region; and
    forming a second contact hole through the interlayer insulating film to expose a portion of the pixel array region.

11. The method of claim 10, wherein:
    the first conductive layer is formed in at least the first contact hole, the second contact hole, and the capacitor hole;
    the second conductive layer is formed on the first conductive layer to fill and cover the capacitor hole, the first contact hole, and the second contact hole; and
    planarizing the second conductive layer includes forming a second contact plug in the second contact hole and a second contact barrier film beneath the second contact plug.

12. The method of claim 10, wherein:
    the dielectric film is further formed on the interlayer insulating film; and
    the first and second contact holes are formed through the dielectric film and the interlayer insulating film.

13. The method of claim 10, wherein:
    patterning the poly silicon layer includes forming a second gate electrode in the logic region; and
    the lower electrode, the first gate electrode, and the second gate electrode are formed simultaneously.

14. The method of claim 10, further comprising:
    forming a third contact hole through the interlayer insulating film to expose a portion of the logic region of the semiconductor substrate; wherein,
    the first conductive layer is formed in at least the first contact hole, the second contact hole, the third contact hole, and the capacitor hole;
    the second conductive layer is formed on the first conductive layer to fill and cover the capacitor hole, the first contact hole, the second contact hole, and the third contact hole; and
    planarizing the second conductive layer includes forming a third contact plug in the third contact hole, a third contact barrier film beneath the third contact plug, a second contact plug in the second contact hole, and a second contact barrier film beneath the second contact plug.

15. The method of claim 14, wherein:

the capacitor plug, the first contact plug, the second contact plug, and the third contact plug are formed simultaneously; and the upper electrode, the first contact barrier film, the second contact barrier film, and the third contact barrier film are formed simultaneously.

16. The method of claim 1, further comprising:

forming a polysilicon layer on the substrate including a pixel array region and a logic region;

patterning the polysilicon later to form a first gate electrode in the pixel array region and the lower electrode in the logic region;

forming an upper electrode layer on an at least the dielectric film and exposed portions of the interlayer insulating film; and forming a capacitor barrier film that includes a portion of the first conductive layer remaining in the capacitor hole.

17. The method of claim 16, wherein:

the upper electrode layer is formed on an entire exposed surface of the interlayer insulating film and the dielectric film;

the upper electrode includes a portion of the upper electrode layer remaining in the capacitor hole; and the first contact barrier film includes a portion of the first conductive layer remaining in the first contact hole.

18. The method of claim 16, wherein:

patterning the poly silicon layer includes forming a second gate electrode in the logic region; and the lower electrode, the first gate electrode, and the second gate electrode are formed simultaneously.

19. The method of claim 16, further comprising:

forming a second contact hole through the interlayer insulating film to expose a portion of the pixel array region; wherein, the first conductive layer is formed in at least the first contact hole, the second contact hole, and the capacitor hole;

the second conductive layer is formed on the first conductive layer to fill and cover the capacitor hole, the first contact hole, and the second contact hole; and planarizing the second conductive layer includes forming a second contact plug in the second contact hole and a second contact barrier film beneath the second contact plug.

20. The method of claim 19, further comprising:

forming a third contact hole through the interlayer insulating film to expose another portion of the logic region of the semiconductor substrate; wherein, the first conductive layer is formed in at least the first contact hole, the second contact hole, the third contact hole, and the capacitor hole;

the second conductive layer is formed on the first conductive layer to fill and cover the capacitor hole, the first contact hole, the second contact hole, and the third contact hole; and planarizing the second conductive layer includes forming a third contact plug in the third contact hole and a third contact barrier film beneath the third contact plug.

* * * * *